United States Patent
Ueyama

[11] Patent Number: 6,140,750
[45] Date of Patent: Oct. 31, 2000

[54] ACTUATOR USING ELECTROMECHANICAL TRANSDUCER AND APPARATUS EMPLOYING THE ACTUATOR

[75] Inventor: Masayuki Ueyama, Takarazuka, Japan

[73] Assignee: Minolta Co., Ltd., Osaka, Japan

[21] Appl. No.: 09/060,067

[22] Filed: Apr. 14, 1998

[30] Foreign Application Priority Data

Apr. 14, 1997 [JP] Japan ................................. 9-110122
Apr. 14, 1997 [JP] Japan ................................. 9-110123
Apr. 14, 1997 [JP] Japan ................................. 9-110124

[51] Int. Cl.⁷ .......................... H02N 2/00; H01L 41/08
[52] U.S. Cl. .................... 310/369; 310/317; 310/328; 310/366; 310/323.02
[58] Field of Search ............... 310/317, 328, 310/366, 367, 369, 311, 323.01, 323.06, 323.17

[56] References Cited

U.S. PATENT DOCUMENTS

| | | | |
|---|---|---|---|
| 3,246,608 | 4/1966 | Cooper | 310/328 |
| 4,087,715 | 5/1978 | Myer | 310/317 |
| 4,630,941 | 12/1986 | Chainer et al. | 384/1 |
| 4,874,979 | 10/1989 | Rapp | 310/328 |
| 4,947,077 | 8/1990 | Murata | 310/328 |
| 5,589,723 | 12/1996 | Yoshida et al. | 310/328 |

FOREIGN PATENT DOCUMENTS

| | | | |
|---|---|---|---|
| 3-32377 | 2/1991 | Japan | 310/311 |
| 4-212910 | 8/1992 | Japan | G02B 7/04 |
| 591975 | 2/1978 | U.S.S.R. | 310/328 |

*Primary Examiner*—Thomas M. Dougherty
*Attorney, Agent, or Firm*—Sidley & Austin

[57] ABSTRACT

A linear actuator using a piezoelectric element having high mechanical strength, high driving efficiency and high reliability in which left and right end portions of the piezoelectric element in a tubular shape whose major component is PZT are fixedly supported by supporting members and a slider is frictionally coupled to the piezoelectric element, the slider frictionally coupled to the piezoelectric element is moved by causing elongation displacement and contraction displacement respectively to electrodes at the left and right end portions of the piezoelectric element when drive pulses each in a saw tooth wave having gradual rise portion and steep fall portion are applied to the electrodes at the left and right end portions of the piezoelectric element in a tubular shape and the slider can continuously be moved by continuously applying the drive pulses.

25 Claims, 15 Drawing Sheets

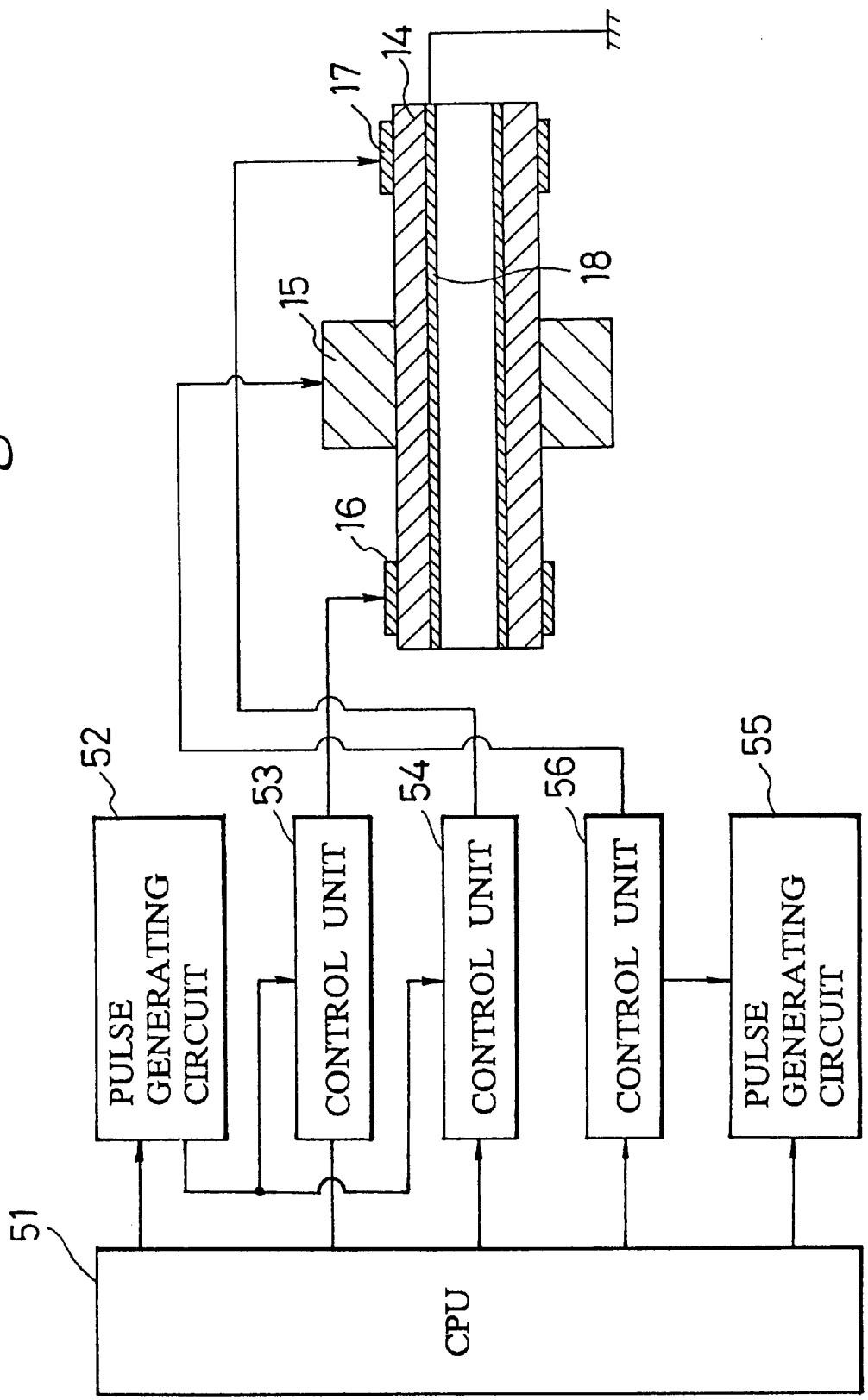

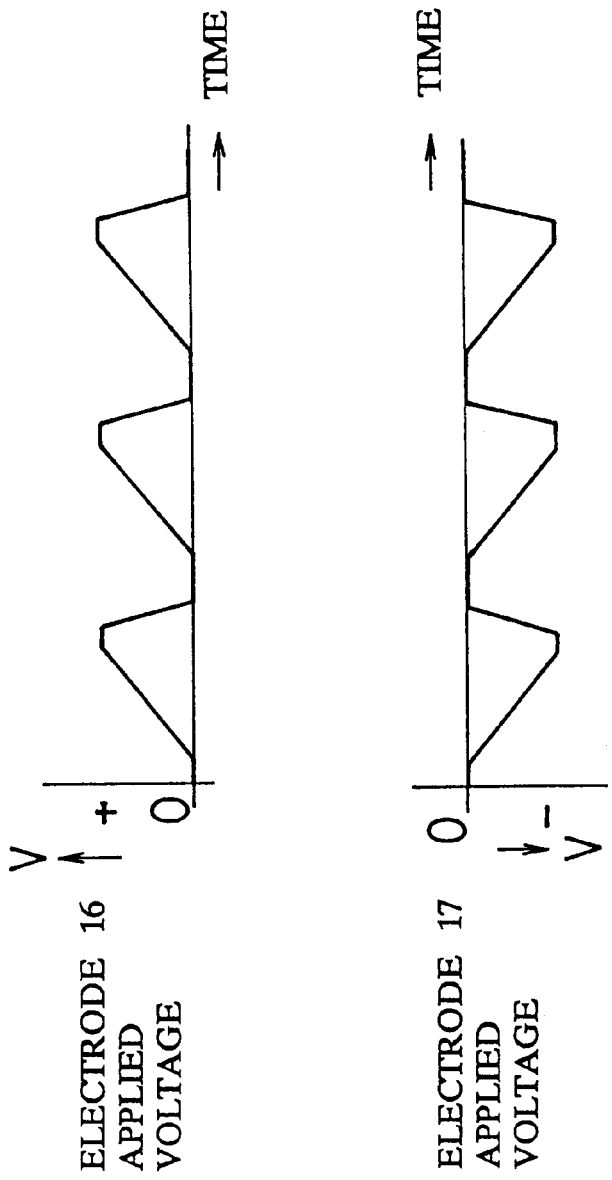

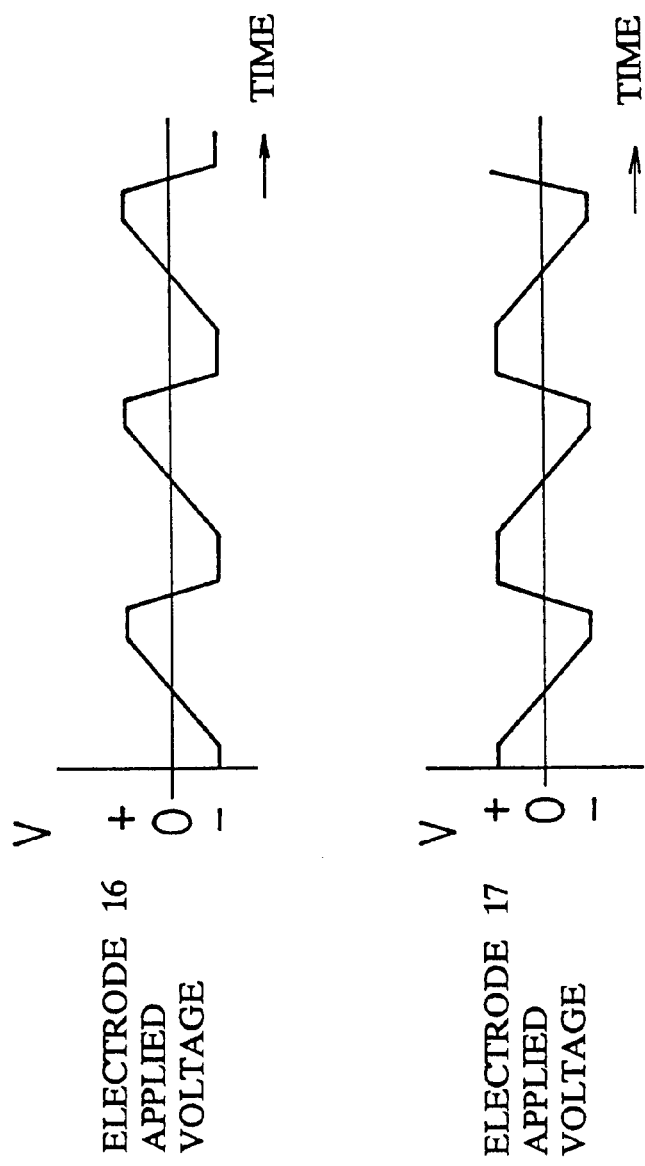

ACTUATOR USING ELECTROMECHANICAL TRANSDUCER AND APPARATUS EMPLOYING THE ACTUATOR

This application is based on patent applications No(s). 9-110122, 9-110123 and 9-110124 filed in Japan, the contents of which are hereby incorporated by reference.

BACKGROUND OF THE INVENTION

1. Field of the Invention

The present invention relates to an actuator using an electromechanical transducer, particularly to an actuator using an electromechanical transducer suitable for finely positioning an optical system of a lens or the like.

The present invention also relates to an apparatus such as an optical system which employs an actuator using an electromechanical transducer.

2. Prior Art

When a drive pulse having a waveform comprising a gradual rise portion and a steep fall portion successive thereto is applied to a piezoelectric element, gradual elongation is caused in the thickness direction of the piezoelectric element at the gradual rise portion of the drive pulse and rapid contraction is caused at the steep fall portion. Hence, there is known an actuator of a linear type in which by using the characteristic, charge and discharge are repeated at different speeds by applying a drive pulse having the above-described waveform to a piezoelectric element and a drive shaft member fixedly attached to the piezoelectric element is reciprocated at different speeds by generating oscillation in the thickness direction having different speeds at the piezoelectric element thereby moving a moving member frictionally coupled to the drive shaft member in a predetermined direction.

According to the above-described actuator of a linear type using a piezoelectric element, there have been pointed out problems of transmission efficiency where a drive force transmitted from the piezoelectric element is not efficiently transmitted to a drive shaft member by elasticity of an adhesive agent since the drive shaft member is coupled to the piezoelectric element by adhesion, and a problem in reliability where an adheringly coupled portion is liable to peel off and so on. Further, there has been pointed out a problem of a difficulty in assembling steps where careful attention is needed in coupling the drive shaft member with the piezoelectric element such that no deviation or inclination of an axis is caused, and the like.

Further, according to the above-described linear type actuators using a piezoelectric element, a frictonally coupled portion for coupling the drive shaft member with the moving member is frictionally coupled previously by a predetermined constant force. When the drive shaft member is reciprocated at different speeds, in the case of motion having slow speed, the moving member is moved in a predetermined object direction under a state where the drive shaft member and the moving member are frictionally coupled. In the case of motion in an opposed direction having a fast speed, slip is caused at the frictionally coupled portion by inertia of the moving member, and the moving member tends to stay at the position.

By repeating the reciprocating motion of the drive shaft member at different speeds, the moving member is moved in the predetermined object direction while causing a slip between the drive shaft member and the moving member. Hence, a portion of the drive energy applied to the drive shaft member is dissipated by the slip caused between the drive shaft member and the moving member, and the drive efficiency is not excellent.

Further, according to the above-described linear type actuators using a piezoelectric element, a side of the drive shaft member opposed to a side where the piezoelectric element is fixedly attached constitutes a free end and accordingly, although the drive shaft member can be oscillated in the axial direction by the oscillation of the piezoelectric element in the thickness direction, at the same time, oscillation in a direction orthogonal to the axial direction is also caused in the drive shaft member. Therefore, this causes the inconvenience that not only is the efficiency of the actuator lowered, but noise is generated.

Further, an oscillation wave in the axial direction is transmitted to the drive shaft member and reflected by the free end. Accordingly, a reflected wave and the oscillation wave transmitted from the piezoelectric element to the drive shaft member interfere with each other, as a result, the waveform of the drive pulse transmitted from the piezoelectric element to the drive shaft member is distorted and the driving operation cannot be carried out efficiently.

Further, there is a problem in reliability and the transmission efficiency of an applied force. The mechanical strength is not sufficient because one end of the drive shaft member is a free end, and since the piezoelectric element and the drive shaft member are coupled by adhesion, an adheringly coupled portion is liable to peel off. Furthermore, there has been the problem that the number of assembling steps is large.

SUMMARY OF THE INVENTION

It is a principal object of the present invention to provide an actuator using an electromechanical transducer having a novel constitution capable of transmitting displacement caused in the electromechanical transducer efficiently to a moving member.

It is another object of the present invention to provide an actuator using an electromechanical transducer having a novel constitution where a constitution of transmitting displacement of the electromechanical transducer directly to a moving member is adopted, reliability is excellent, the number of parts is small and assembling is facilitated.

It is another object of the present invention to provide an actuator using an electromechanical transducer having a novel constitution in which reciprocating oscillation having different speeds is caused by elongation displacement and contraction displacement. The elongation displacement and contraction displacement is caused at the vicinities of both end portions of the electromechanical transducer in the axial direction by applying drive voltages to two electrodes formed at the both end portions of the electromechanical transducer in the axial direction by which a moving member that is frictionally coupled to the electromechanical transducer is moved in a predetermined direction.

It is a further object of the present invention to provide an apparatus employing the aforesaid actuator.

Other objects of the invention will become apparent from a detailed explanation of the present invention in reference to the drawings.

BRIEF DESCRIPTION OF THE DRAWINGS

FIG. 6 is a block diagram showing a control circuit of the actuator;

FIGS. 8(a) and 8(b) are diagrams for explaining waveforms of drive pulses applied to the piezoelectric element;

FIGS. 9(a) and 9(b) are diagrams for explaining other waveform examples of drive pulses applied to the piezoelectric element;

DETAILED DESCRIPTION OF THE PREFERRED EMBODIMENTS

Figure 1:
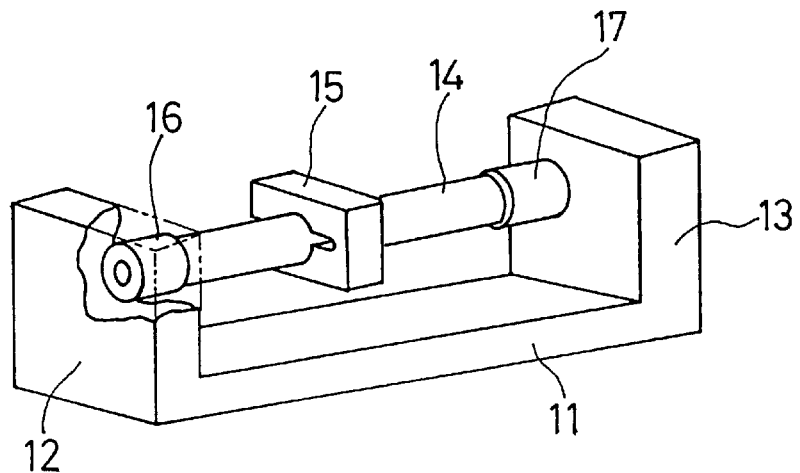
FIG. 1 is a perspective view showing the constitution of an actuator using an electromechanical transducer according to one embodiment.
Figure 2:
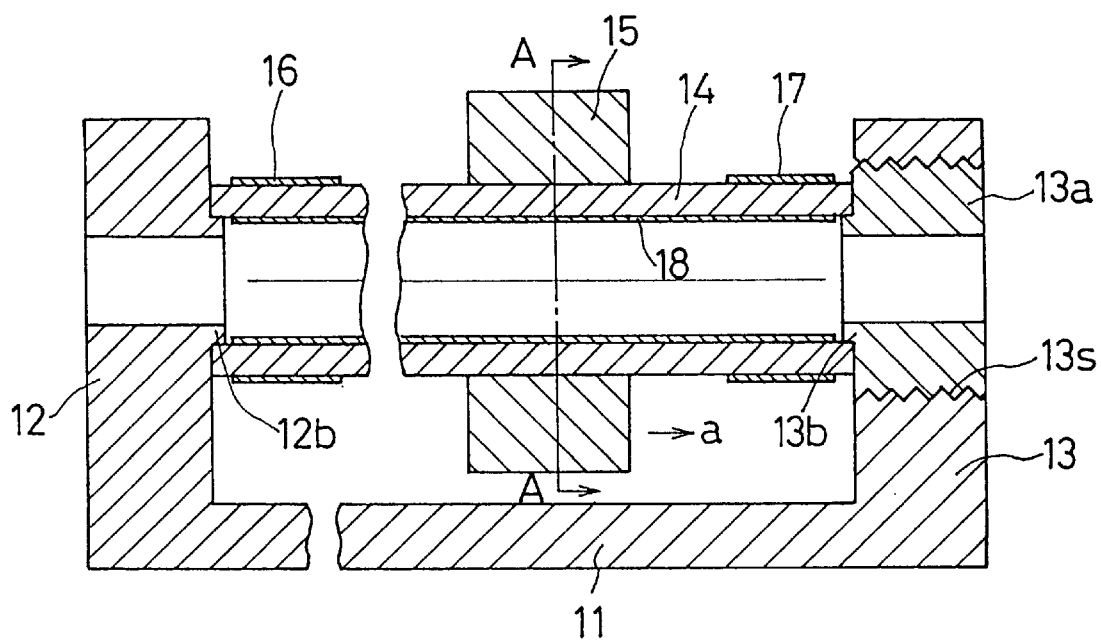
FIG. 2 is a cross-sectional view of the actuator shown in FIG. 1.
Figure 3:
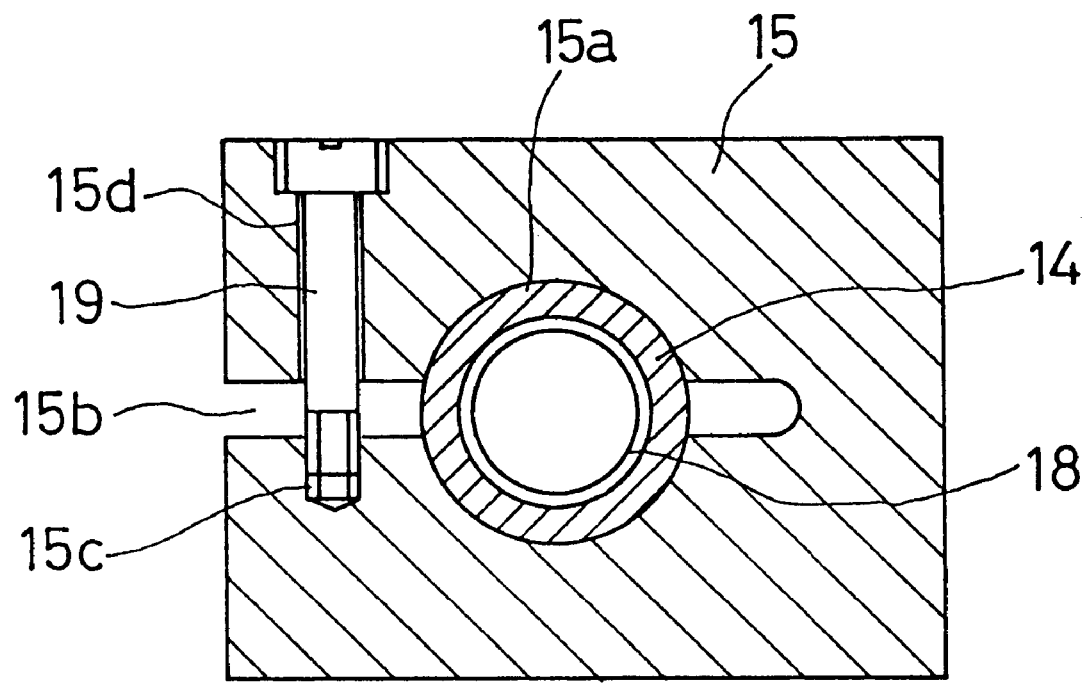
FIG. 3 is a sectional view of a slider taken along a line A—A of FIG. 2.

An explanation will be given of embodiments of the present invention as follows. FIG. 1 is a perspective view showing the constitution of an actuator according to the embodiment, FIG. 2 is a cross-sectional view thereof, and FIG. 3 is a sectional view taken along a line A—A of FIG. 2. In FIG. 1 through FIG. 3, numeral 11 designates a base, numerals 12 and 13 designate supporting members, numeral 14 designates a piezoelectric element in a tubular shape, and a slider 15 is fitted to the piezoelectric element.

An annular projection 12b fitted to the inner diameter of the piezoelectric element 14 in a tubular shape is formed at the supporting member 12. Further, at the supporting member 13, a threaded portion 13s is formed, a fastening member 13a is movably received by the threaded portion 13s and an annular projection 13b fitted to the inner diameter of the piezoelectric element 14 in a tubular shape is formed at the fastening member 13a. Left and right tubular end portions of the piezoelectric element 14 are fitted to the annular projection 12b and the annular projection 13b, and the fastening member 13a is screwed in by which the piezoelectric element 14 can be fixedly supported solidly between the supporting members 12 and 13 by pressing the piezoelectric element 14 in the axial direction.

The piezoelectric element 14 is formed in a tubular shape, constituted by a piezoelectric ceramics whose major component is PZT ($PbZrO_3$ $PbTiO_3$,) in which outer electrodes 16 and 17 are formed at left and right ends of an outer face thereof, and an inner electrode 18 is also formed over an entire inner face. A first electrode portion is constituted by the outer electrode 16 and the inner electrode 18, and a second electrode portion is constituted by the outer electrode 17 and the inner electrode 18. Lead wires are connected to the outer electrodes 16 and 17 and the inner electrodes 18 by suitable means and are connected to a drive source, not illustrated.

A hole 15a fitted to an outer side of the piezoelectric element 14 and a slit 15b crossing the hole 15a are formed at the central portion of the slider 15, and the slider 15 is frictionally coupled to the piezoelectric element 14 at the portion of the hole 15a as shown in FIG. 3. A through hole 15d for a screw 19 is formed at an upper side portion of the slider 15 divided by the slit 15b, a screw hole 15c is formed at a divided lower side portion thereof. By fastening the screw 19 (inserted into the through hole 15d) the screw hole 15c, a frictional coupling force between the slider 15 and the piezoelectric element 14 is adjusted. In order to adjust the frictional coupling force exerted between the slider and the piezoelectric element, other suitable means, for example, a constitution where the slider 15 is divided into two upper and lower members and the two members are fastened by a screw via a spring or the like, can suitably be adopted.

Here, an explanation will be given of the characteristic of the piezoelectric element of the PZT group in reference to FIG. 4. When a positive electric field is applied from an unpolarized initial state, the piezoelectric element is polarized along the direction of the electric field, at the same time, elongation displacement is caused in the direction of the electric field and contraction displacement is caused in a direction orthogonal to the direction of the electric field (state (1) in FIG. 4). When the electric field is weakened gradually, the displacement is also reduced, however, the polarized state remains even when the electric field is nullified and residual strain $\Delta Lr$ remains (state (2) in FIG. 4).

Figure 4:
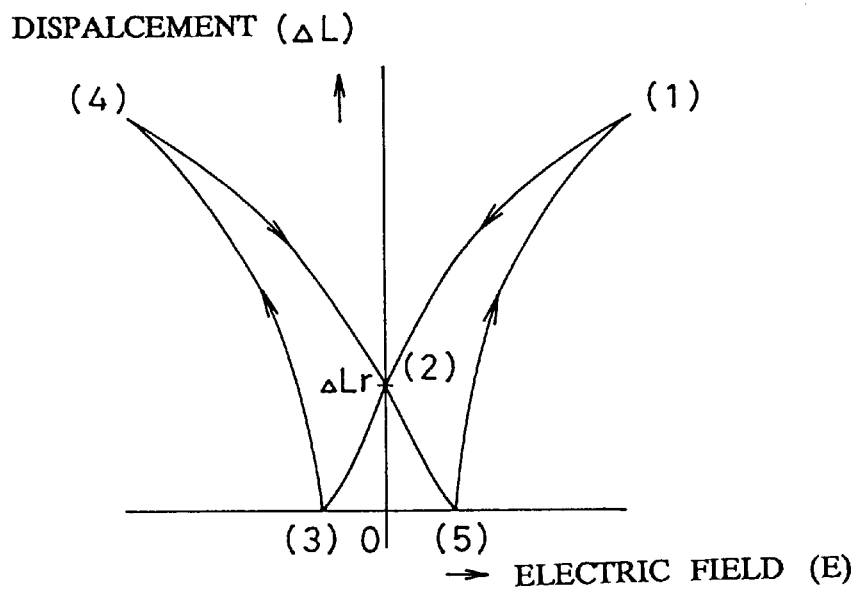
FIG. 4 is a diagram for explaining a characteristic of a piezoelectric element of a PZT group.

When the electric field is applied in a negative direction (direction opposed to the previous direction), the displacement returns to the initial state of null (state (3) in FIG. 4), the direction of polarization is reversed, and displacement is caused again in the elongation direction (state (4) in FIG. 4). When the electric field is weakened gradually, the displacement is also reduced, however, even when the electric field is nullified, the polarized state remains and the residual strain $\Delta Lr$ remains (state (2) in FIG. 4). When the electric field is applied in the positive direction, the displacement returns to the initial state of null (state (5) in FIG. 4), the direction of polarization is reversed, and the displacement is caused again in the elongation direction (state (1) in FIG. 4).

Figure 5:
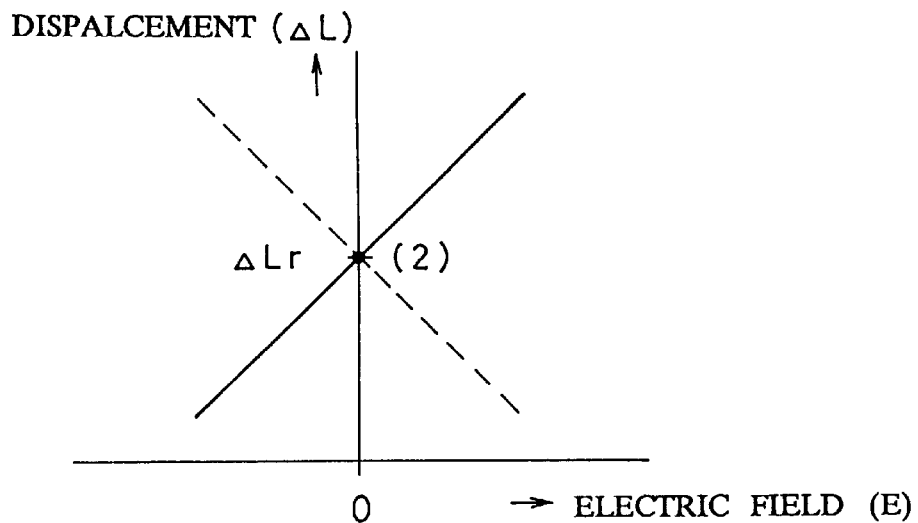
FIG. 5 is a diagram for explaining a region where electric field and displacement are substantially proportional to each other in the piezoelectric element of a PZT group.

Although the piezoelectric element shows the characteristics explained above, according to the present embodiment, the piezoelectric element is used in a region at the vicinity of a portion designated by (2) in FIG. 4 where the displacement is substantially proportional to a change in the electric field, that is, a region shown in FIG. 5. In this region, when the original point is designated by a point where the electric field intensity is nullified, elongation displacement (contraction displacement) ΔL is expressed by the following equation.

$$\Delta L = LdV/t$$

where, L: length of piezoelectric element,

V: voltage applied to piezoelectric element, t: thickness between electrodes of piezoelectric element, d: piezoelectric constant.

That is, in the region shown in FIG. 5, the elongation displacement (contraction displacement) ΔL is proportional to the length L of the piezoelectric element and the voltage V applied to the piezoelectric element and is inversely proportional to the thickness t between electrodes of the piezoelectric element.

FIG. 6 is a block diagram showing a control circuit of the actuator and the control circuit is constituted by CPU 51, a pulse generating circuit 52, and control units 53 and 54. Further, a pulse generating circuit 55 and a control unit 56 are circuit elements used in controlling actuators shown in FIG. 10 and FIG. 12, and an explanation will be given later of these portions in reference to FIG. 10 and FIG. 12.

The pulse generating circuit 52 generates, under the control of CPU 51, a drive pulse (positive voltage pulse) having a gradual rise portion and a steep fall portion as shown in FIG. 8(a) and a drive pulse of inverse polarity (negative voltage pulse) having a gradual rise portion (concerning the negative voltage direction) and a steep fall portion (concerning a negative voltage direction) as shown in FIG. 8(b) which are applied to the outer electrodes 16 and 17 via the control units 53 and 54. Further, the inner electrode 18 is grounded.

Next, an explanation will be given of the operation of the actuator according to the present embodiment. FIGS. 7(a) through 7(d) are schematic views for explaining the operation of the actuator shown in FIG. 1 and FIG. 2 where actual motion is shown by exaggeration for easy understanding of the operation.

Firstly, both the first electrode portion, which is composed of the outer electrode 16 and the inner electrode 18, and the second electrode portion, which is composed of the outer electrode 17 and the inner electrode 18 of the piezoelectric element 14, are polarized in the same direction as the radius direction during fabrication and are brought into a state (2) of FIG. 4. They can be polarized by generating electric fields in the same direction by applying direct current of a predetermined voltage between the outer electrode 16 and the inner electrode 18 as well as between the outer electrode 17 and the inner electrode 18 by utilizing the characteristic of the piezoelectric element described above.

Figure 7A:
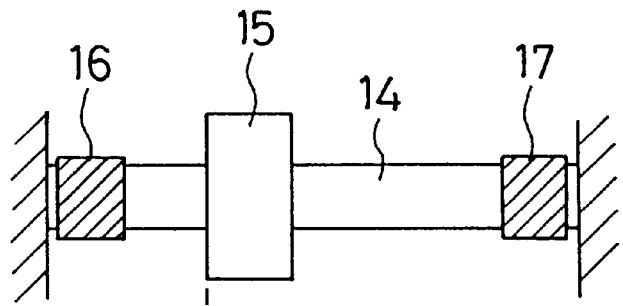
FIGS. 7(a), 7(b), 7(c) and 7(d) are views for explaining the operation of the actuator.

FIG. 7(a) is a view showing an initial state where both the first and the second electrode portions of the piezoelectric element 14, polarized in the same direction as the radius direction, are not subject to applied drive pulses.

Figure 7B:
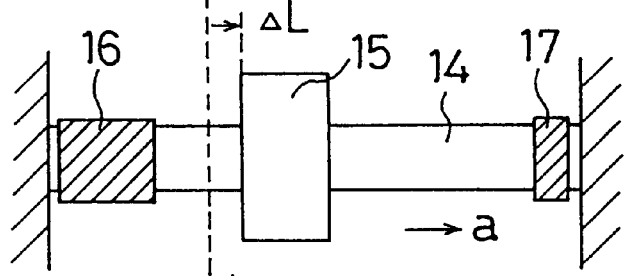

When subject to an applied voltage, a drive pulse (positive voltage pulse) having a gradual rise portion and a steep fall portion, as shown by FIG. 8(a), is applied to the outer electrode 16, and a drive pulse of inverse polarity (negative voltage pulse) having a gradual rise portion, and a steep fall portion, as shown in FIG. 8(b), is applied to the outer electrode 17. Then, elongation displacement is caused in a portion of the outer electrode 16 (first electrode portion) and contraction displacement is caused in a portion of the outer electrode 17 (second electrode portion) at the gradual rise portion of the drive pulse by which a state shown in FIG. 7(b) is produced. The vicinity of the center of the piezoelectric element 14 is moved in a direction consistent with arrow "a". As a result, the slider 15, frictionally coupled to the piezoelectric element 14, is moved in the "a" direction by ΔL.

Figure 7C:
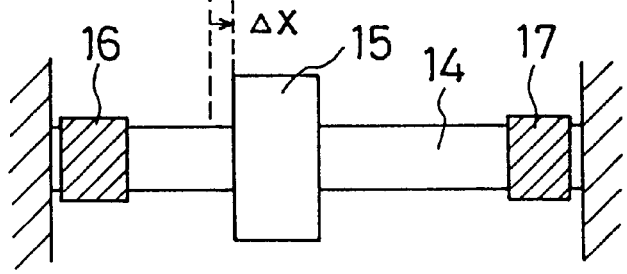
Figure 7D:
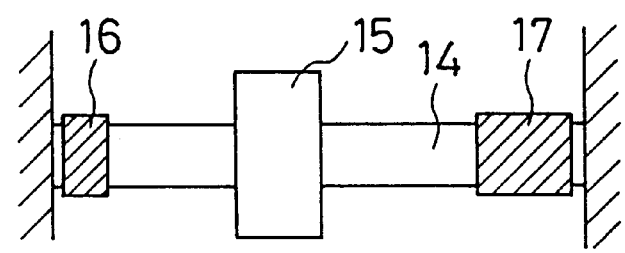

Next, at the steep fall portion of the drive pulses, rapid contraction displacement and rapid elongation displacement are caused and the displacements caused in the outer electrodes 16 and 17 return to the original state. In this case, the inertia force of the slider 15 overcomes the frictional coupling force between the slider 15 and the piezoelectric element 14 and operates to make the slider 15 remain generally at the position by causing slip between the slider 15 and the piezoelectric element 14. Therefore, as a result, the slider 15 is moved in the "a" direction by ΔX from the condition of FIG. 7(a), as the slider 15 is pulled back slightly from the condition of FIG. 7(b). FIG. 7(c) shows this state.

By repeating the above-described operation of applying to the outer electrodes 16 and 17 the drive pulses having the gradual rise portion and the steep fall portion as shown in FIGS. 8(a) and 8(b), the slider 15 can be moved in the "a" direction while causing slip between the slider 15 and the piezoelectric element 14. By making the repetition frequency higher than audible frequencies, that is, frequencies in a supersonic wave region of 20 kHz or higher, high speed driving can be carried out with no generation of noise, which might otherwise produce an unpleasant feeling to the human ear.

In order to move the slider 15 in a direction opposed to the "a" direction, the movement can be achieved by applying a drive pulse (positive voltage pulse) having a gradual rise portion and a steep fall portion, as shown in FIG. 8(a), to the outer electrode 17 and by applying a drive pulse (negative voltage pulse) having a gradual rise portion and a steep fall portion, as shown in FIG. 8(b), to the outer electrode 16.

FIGS. 9(a) and 9(b) show waveforms of drive pulses produced by deviating the drive pulses shown in FIGS. 8(a) and 8(b) respectively in the negative direction and the positive direction and distributing them above and below zero potential. When the drive pulses are applied to the outer electrodes 16 and 17, at first, contraction displacement is caused in a portion of the outer electrode 16 and elongation displacement is caused in a portion of the outer electrode 17, and they are brought into a state shown in FIG. 7(d) and are changed into states of FIG. 7(b) and FIG. 7(c) successively by changes in the drive pulse voltages. By distributing the drive pulses above and below zero potential, amplitudes of the drive pulses in the region of the electric field, until polarization reversal is caused as shown in FIG. 5, can be increased and the drive speed can be promoted.

In the above description, an explanation has been given such that both the first electrode portion, which is composed of the outer electrode 16 and the inner electrode 18, and the second electrode portion, which is composed of the outer electrode 17 and the inner electrode 18, of the piezoelectric element 14 are polarized in the same direction in the radius direction. However, the first electrode portion composed of the outer electrode 16 and the inner electrode 18 and the second electrode portion composed of the outer electrode 17 and the inner electrode 18 may be polarized in directions opposite to each other.

In order to polarize them in reverse directions, electric fields in directions opposite to each other may be generated by applying direct current of predetermined voltage between the outer electrode 16 and the inner electrode 18, and by applying direct current of inverse polarity between the outer electrode 17 and the inner electrode 18 during fabrication. In this case, it is not necessary to change the voltage waveforms of the drive pulses applied to the outer electrodes 16 and 17 and the drive pulses having quite the same waveforms may be used.

Figure 10:
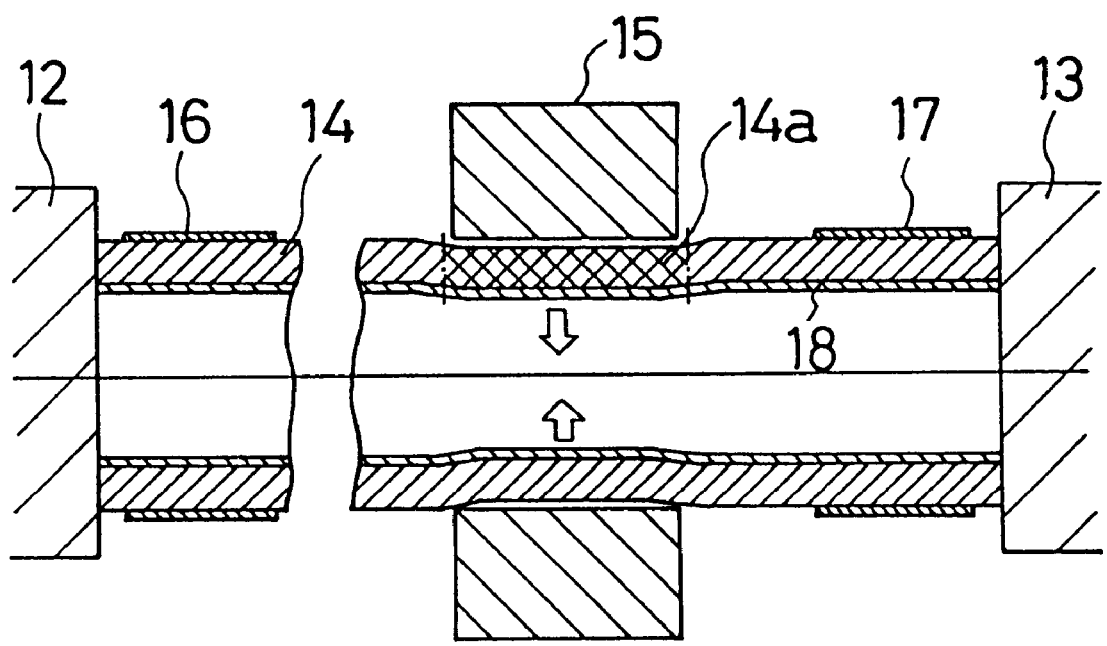
FIG. 10 is a sectional view showing the constitution of an actuator where a slider is constituted by a conductive material.

FIG. 10 is a sectional view showing an actuator of another embodiment in which the slider 15 explained in reference to FIG. 1 through FIG. 3 is made of a conductive material and an electric field is applied at a portion 14a of the piezoelectric element 14 to which the slider 15 is frictionally coupled by applying voltage in a positive direction to the slider 15. According to the constitution, the frictional coupling force between the slider 15 and the piezoelectric element 14 can be controlled by increasing or decreasing the voltage applied to the slider 15.

That is, when an electric field is generated by applying voltage in the positive direction between the slider 15 and the inner electrode 18, the tubular shaped piezoelectric element 14a at this portion tends to elongate in the thickness direction of the tube and contract in the circumferential direction of the tube, however, the thickness of the tube is smaller than the radius and the circumferential length of the tube and accordingly, the tube is contracted in the radius direction as shown in FIG. 10.

Figures 11A, 11B, 11C, 11D:
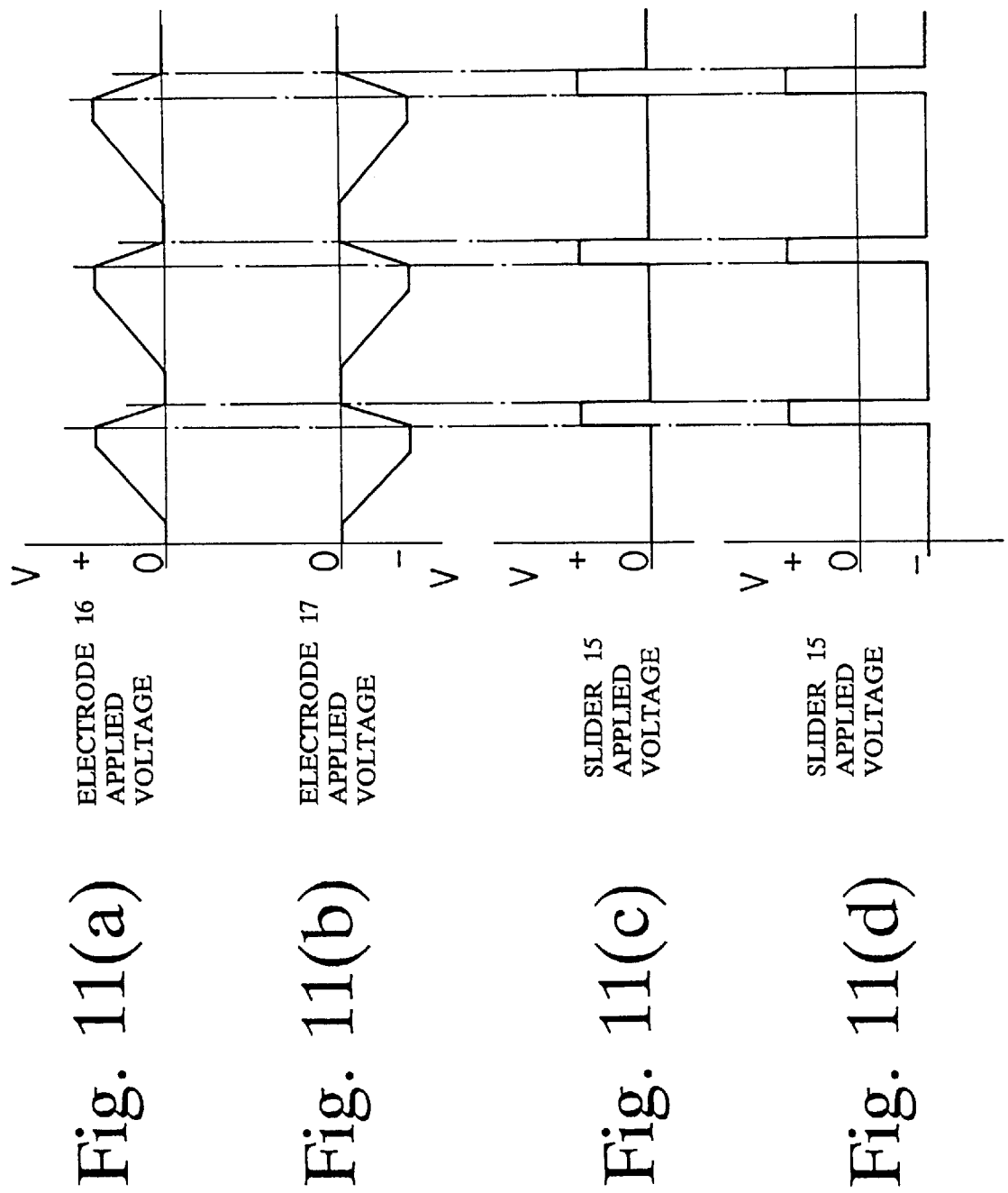
FIGS. 11(a), 11(b), 11(c) and 11(d) are diagrams for explaining waveforms of drive pulses applied to the actuator shown in FIG. 10.

Hence, in respect of the piezoelectric element 14, as has been explained above, a drive pulse shown in FIG. 11(a) is applied to the outer electrode 16 and a drive pulse shown in FIG. 11(b) is applied to the outer electrode 17. At a time point where the gradual rise portion of the drive pulse is applied, a voltage is not applied to the slider 15, and the slider 15 is moved while maintaining a frictionally coupled state between the slider 15 and the piezoelectric element 14.

At a time point where the steep fall portion of the drive pulses are applied to the outer electrodes 16 and 17, voltage in a positive direction is applied to the slider, as shown in FIG. 11(c), the portion 14a of the piezoelectric element 14 is contracted in the radius direction by which the frictional coupling force between the slider 15 and the portion 14a is weakened for easy sliding.

The above-described control is executed by the control circuit of the actuator. That is, in the control circuit of the actuator shown in FIG. 6, other than the pulse generating circuit 52 and the control units 53 and 54, the pulse generating circuit 55 and the control unit 56 are further added. The pulse generating circuit 52 generates under control of CPU 51 a drive pulse (positive voltage pulse) having a gradual rise portion and a steep fall portion, as shown in FIG. 11(a) and a drive pulse of inverse polarity (negative voltage pulse) having a gradual rise portion (negative voltage direction), and a steep fall portion (negative voltage direction) as shown in FIG. 11(b), and applies them to the outer electrodes 16 and 17 via the control units 53 and 54. The inner electrode 18 is grounded.

The pulse generating circuit 55 generates, under control of CPU 51, a rectangular pulse having a width substantially equal to that of the steep fall portion, and applies it to the slider 15 via the control unit 56 at a time point in response to the steep fall portion of the drive pulse described above as shown in FIG. 11(c).

Thereby, at the time point in response to the steep fall portion of the drive pulse, the slider 15 and the piezoelectric element 14 are easier to slide relative to each other than a constitution where the voltage is not applied to the slider 15 and as a result, the slider 15 can be moved in the "a" direction by a dimension proximate to ΔL that is larger than the moving distance ΔX in the previous case.

Further, the control may be carried out as shown in FIG. 11(d) in which at a time point where the gradual rise portion of the drive pulses are applied to the outer electrodes 16 and 17, voltage in the negative direction is applied to the slider 15 and the portion 14a of the piezoelectric element 14 is expanded in the radius direction by which the frictional coupling state of the slider 15 and the piezoelectric element 14 is further strongly maintained and at a time point where the steep fall portion of the drive pulses are applied to the outer electrodes 16 and 17, voltage in the positive direction is applied to the slider 15 and the portion 14a of the piezoelectric element 14 is contracted in the radius direction by which the frictional coupling force between the slider 15 and the portion 14a is weakened for easy sliding.

Figure 12:
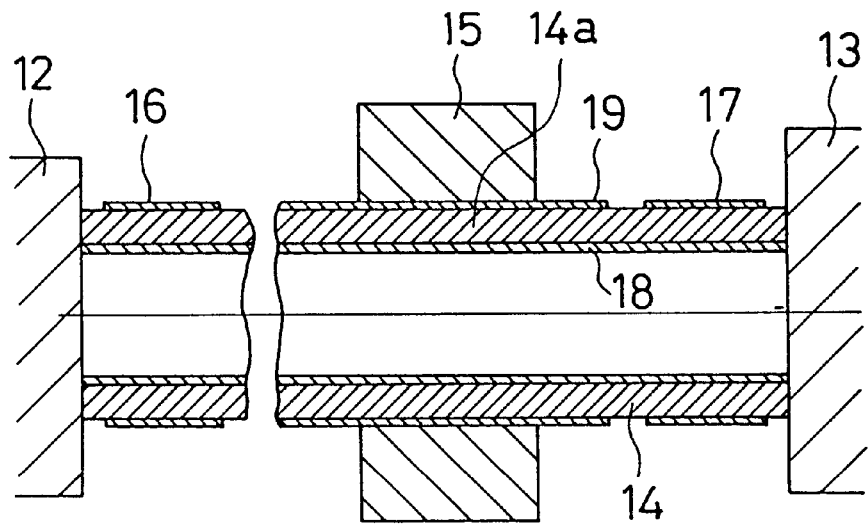
FIG. 12 is a sectional view showing the constitution of an actuator where a third electrode is installed on a piezoelectric element in correspondence with a range of moving a slider.

In a third embodiment shown in FIG. 12, instead of making the slider 15 out of a conductive material as in FIG. 10, a third electrode 19 is provided in a range where the slider 15 on the piezoelectric element 14 is moved.

According to this constitution, at a time point in response to the steep fall portion of the drive pulse generated from the pulse generating circuit 55 of the control circuit of the actuator shown in FIG. 6, a rectangular pulse having a width substantially equal to that of the steep fall portion shown in FIG. 11(c) is generated and applied to the third electrode 19 via the control unit 56. Thereby, at a time point in response to the steep fall portion of the drive pulse, the portion of the electrode 19 of the piezoelectric element 14 can be contracted in the radius direction and accordingly, the frictional coupling force between the slider 15 and the portion 14a can be weakened for easy sliding similar to the actuator having the constitution shown in FIG. 10.

Also in this case, control can be carried out as shown in FIG. 11(d) in which at a time point where the gradual rise portion of the drive pulses is applied to the outer electrodes 16 and 17, the portion 14a of the piezoelectric element 14 is expanded in the radius direction by which the frictionally coupled state between the slider 15 and the piezoelectric element 14 is further strongly maintained, and at a time point where the steep fall portion of the drive pulses is applied thereto, the portion of the electrode 19 of the piezoelectric element 14 is contracted in the radius direction and the frictional coupling force is weakened for easy sliding.

Figure 13:
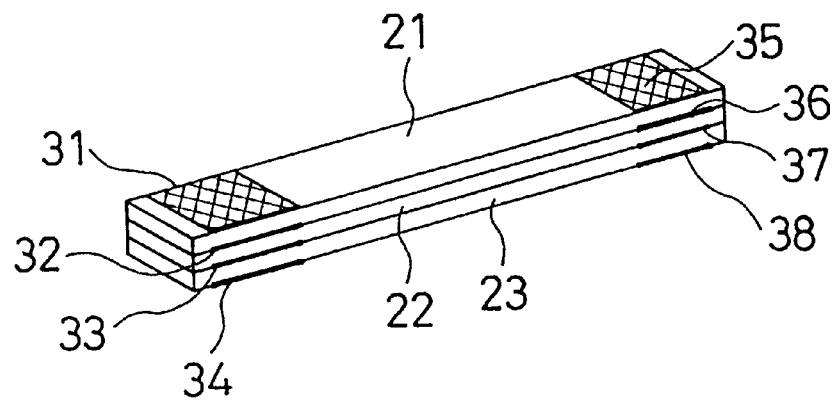
FIG. 13 is a perspective view showing the constitution of a piezoelectric element where unit elements in a flat plate shape are laminated.

Although in the actuators described above tubular piezoelectric elements are used for the piezoelectric elements, in a fourth embodiment as shown in FIG. 13, a piezoelectric element can be constituted by laminating piezoelectric elements 21, 22 and 23 in a flat plate shape, providing electrodes 31, 32, 33 and 34 and electrodes 35, 36, 37 and 38 at the vicinities of the end portions of the laminated piezoelectric elements 21, 22 and 23, and frictionally coupling the slider thereto.

Figure 14:
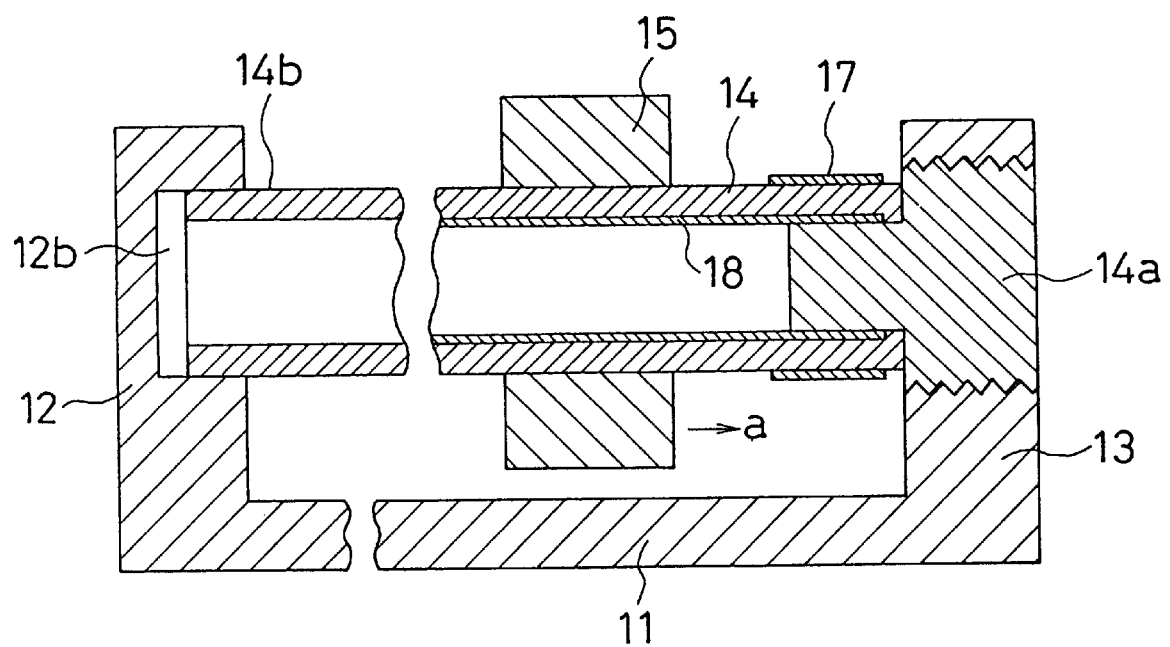
FIG. 14 is a sectional view showing the constitution of an actuator where one end portion of a piezoelectric element in a tubular shape is fixed and the other end portion is constituted by a free end.

FIG. 14 shows a fifth embodiment of the actuator and although the embodiment is similar to the actuator shown in FIG. 1 in view of a point where the piezoelectric element in a tubular shape is supported by a base, in this embodiment, one end portion of a piezoelectric element is fixed and other end portion constitutes a free end portion. The same numbers are attached to elements corresponding to those in the actuator shown in FIG. 1 and a detailed explanation thereof will be omitted.

In FIG. 14, a plug 14a is attached to one end portion of the piezoelectric element 14 and the plug 14a is fixed by screwing it in the supporting member 13 of the base 11. The other end of the piezoelectric element 14 constitutes a free end portion which is inserted into a hole 12b of the supporting member 12 of the base 11 and is supported movably in the axial direction.

The piezoelectric element 14 is constituted by a piezoelectric ceramic whose major component is PZT (PbZrO₃ PbTiO₃), the outer electrode 17 is formed at the fixed end on the outer face and the inner electrode 18 is formed over the entire inner face. The first electrode portion is formed by the outer electrode 17 and the inner electrode 18 and is connected to a drive source.

The slider 15 is provided with a constitution similar to that explained previously in reference to FIG. 3, the hole 15a fitted to the outer side of the piezoelectric element 14 and the slit 15b crossing the hole 15a are formed at a central portion thereof, the slider 15 is frictionally coupled to the piezoelectric element 14 at the portion of the hole 15a, and the screw 19 is fastened to the screw hole 15c by which the frictional coupling force between the slider 15 and the piezoelectric element 14 is adjusted.

In moving the slider 15 in the "a" direction, the movement can be achieved by applying a drive pulse having a gradual rise portion and a steep fall portion as shown in FIG. 8(a) and causing oscillation of elongation and contraction having different speeds at the piezoelectric element 14. In moving the slider 15 in a direction opposed to the arrow mark "a", a drive pulse having a polarity reverse to that of the previous case may be applied.

FIG. 15 through FIG. 18 show a sixth embodiment of the actuator which is a self-propelled actuator having a drive unit which is formed by the actuator shown in FIG. 1.

Figure 15:
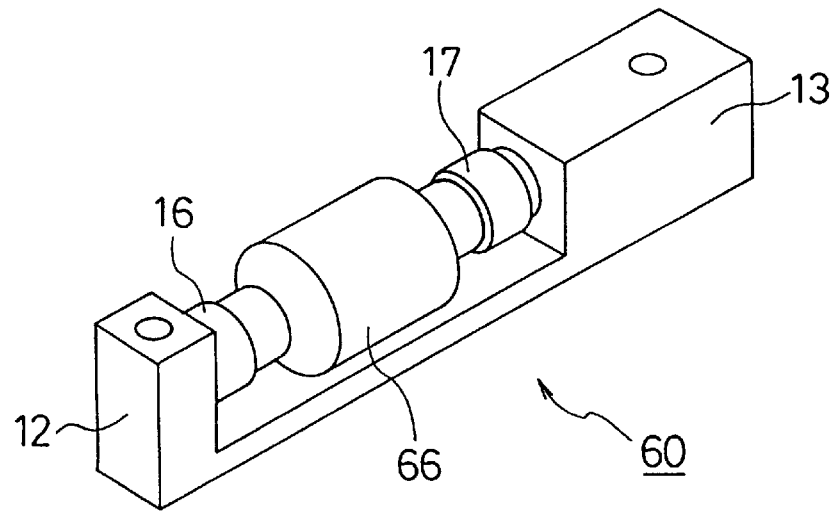
FIG. 15 is a perspective view showing a drive unit of a self-propelled actuator.
Figure 16:
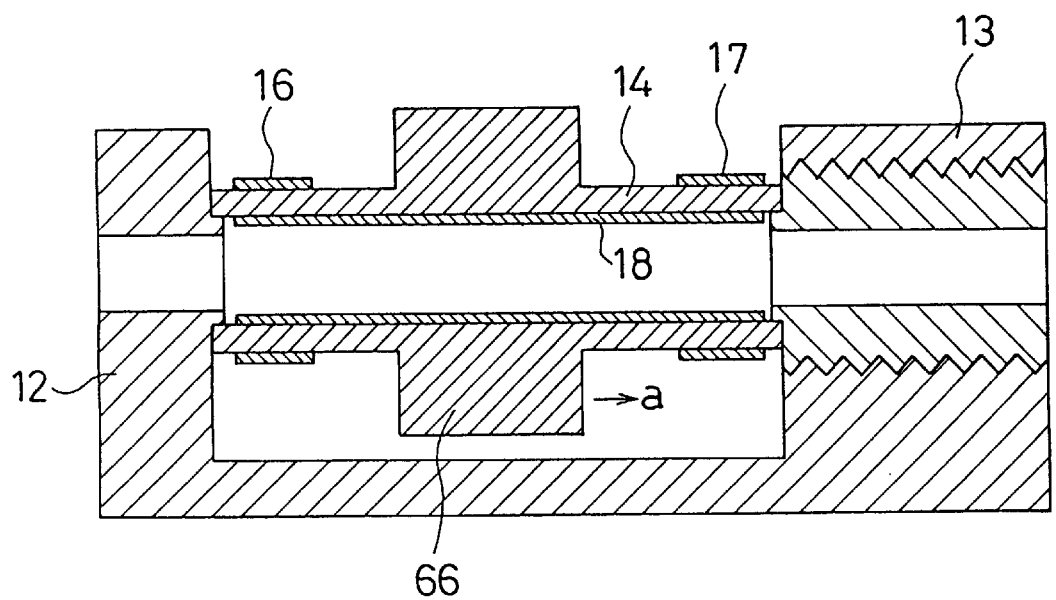
FIG. 16 is a sectional view of the drive unit of the self-propelled actuator shown in FIG. 15.

FIG. 15 is a perspective view showing the outside of a drive unit 60, and FIG. 16 is a sectional view of the drive unit 60. In the actuator shown in FIG. 1, the slider 15 fitted to the outer side of the piezoelectric element 14 in a tubular shape constitutes a cylindrical body 66 integrally fixed to the piezoelectric element 14. The other elements are the same as the constitution shown in FIG. 1 and accordingly, an explanation thereof will be omitted.

Figure 17:
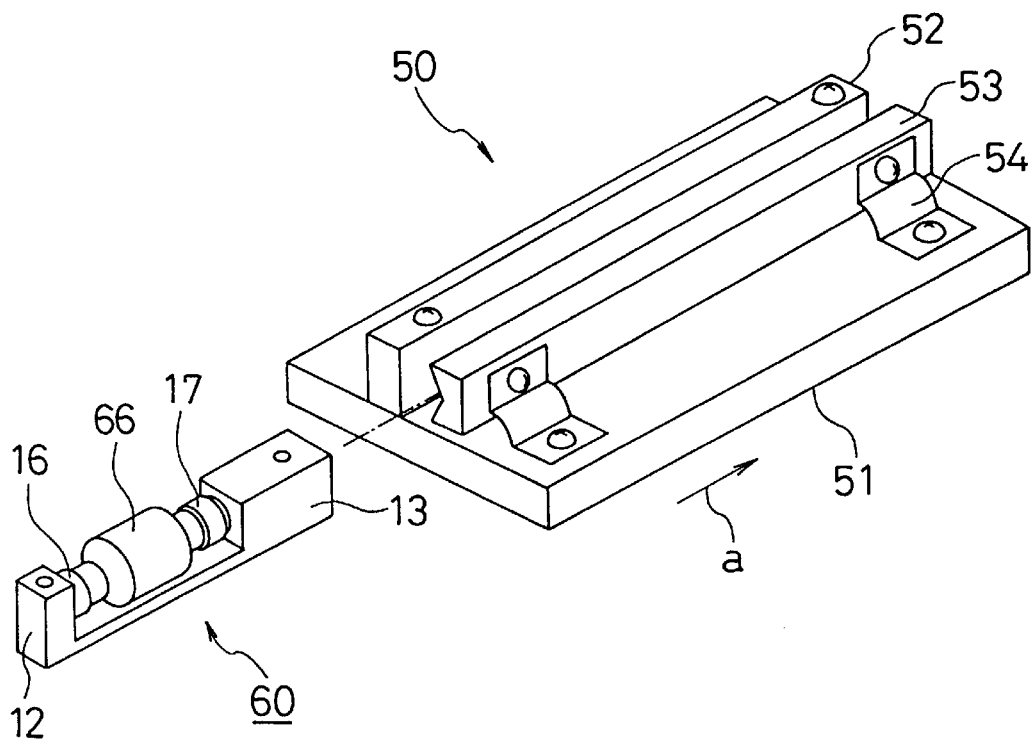
FIG. 17 is a perspective view of a self-propelled actuator and assembly.
Figure 18:
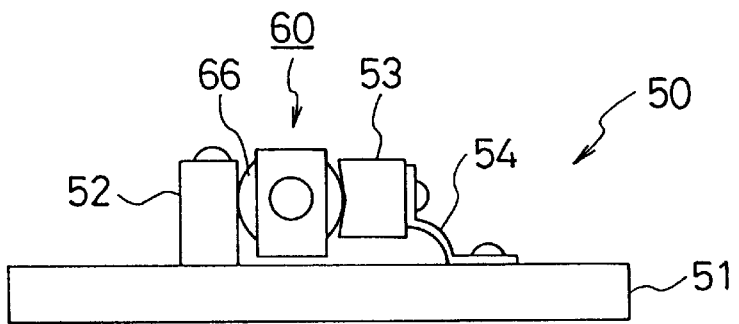
FIG. 18 is a side view of the self-propelled actuator and assembly shown in FIG. 17.

FIG. 17 and FIG. 18 are views for explaining the constitution of a self-propelled type actuator 50 showing a state where the drive unit 60 is disengaged, and FIG. 18 is a side view showing a state where the drive unit 60 is engaged. In FIG. 17 and FIG. 18, the self-propelled type actuator 50 is constituted by a base 51, guide members 52 and 53 arranged on the base 51 at a predetermined interval, and the drive unit 60 sandwiched by and frictionally coupled to the guide members 52 and 53. The guide member 52 is fixed onto the base 51 and the guide member 53 is urged toward the drive unit 60 by springs 54.

Next, an explanation will be given of the operation. The cylindrical body 66 of the drive unit 60 is sandwiched by the guide members 52 and 53 and frictionally coupled thereto by pertinent frictional force. When a drive pulse having a gradual rise portion and a steep fall portion is supplied to the piezoelectric element 14, although gradual elongation displacement is caused in the piezoelectric element 14 at the gradual rise portion of the drive pulse, the drive unit base 11 and supporting members 12 and 13 of the drive unit 60 is moved in a predetermined direction since the cylindrical body 66 is frictionally coupled to the guide members 52 and 53 and remains unmoved. At the steep fall portion of the drive pulse, although rapid contraction displacement is caused in the piezoelectric element 14, the drive unit base 11 and supporting members 12 and 13 tends to remain at the position by inertia force and accordingly, the cylindrical body 66 is moved by overcoming the frictional coupling force with respect to the guide members 52 and 53 and the drive unit base 11 and the supporting members 12 and 13 remains unmoved. The drive unit 60 can be moved relative to the base 51 by continuously applying the drive pulses.

Figure 19:
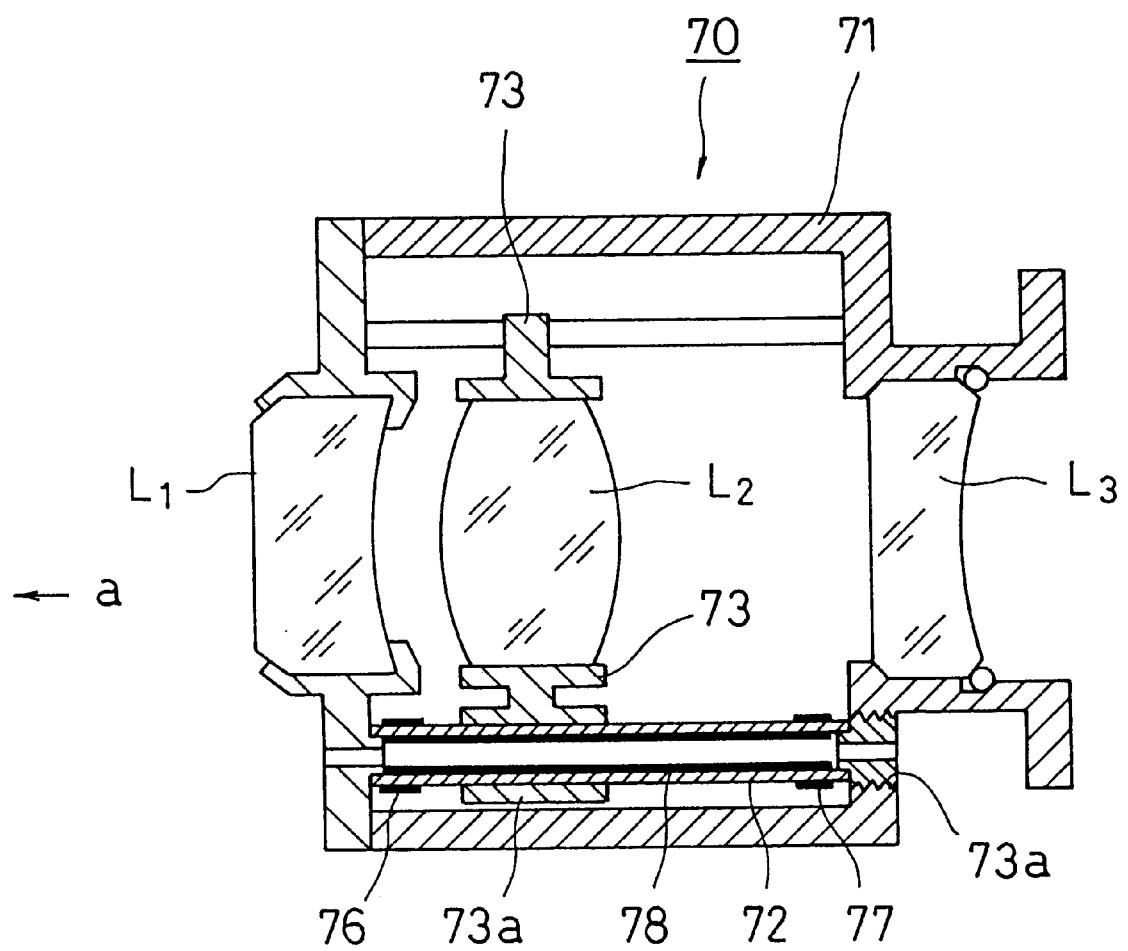
FIG. 19 is a sectional view showing the constitution of an embodiment of a focal point variable lens system.

FIG. 19 shows a seventh embodiment in which an actuator using an electromechanical transducer is employed in a mechanism for moving a lens element of a variable focal point lens system. In FIG. 19, a variable focal point lens 70 system of the present embodiment is provided with a lens barrel 71, fixed lenses L1 and L3, a movable lens L2, a piezoelectric element 72 in a tubular shape for moving the movable lens L2, and a lens frame 73 for supporting the movable lens L2, and so on. The fixed lenses L1 and L3 are fixed to the lens barrel 71 by suitable means.

On the piezoelectric element 72 in a tubular shape, outer electrodes 76 and 77 are provided, and a common electrode 78 is provided inside of the element 72. Further, the lens frame 73 for supporting the movable lens L2 is provided with a frictional coupling portion 73a for frictionally coupling the piezoelectric element 72.

Explaining a relationship thereof in correspondence with the actuator shown in FIG. 1, the piezoelectric element 72 corresponds to the piezoelectric element 14 of the actuator of FIG. 1, the frictionally coupled portion 73a of the lens frame 73 corresponds to the slider 15 of the actuator of FIG. 1, the outer electrodes 76 and 77 and the common electrode 78 are members respectively corresponding to the outer electrodes 16 and 17 and the common electrode 18 of the actuator of FIG. 1, and details of the constitution and the function are as has been explained previously.

The operation is also as has been explained previously, when reciprocating oscillation having different speeds is caused by applying drive pulses of a saw tooth wave between the outer electrodes 76 and 77 and the common electrode 78 of the piezoelectric element 72, the lens frame 73 supporting the movable lens L2 frictionally coupled to the piezoelectric element 72 can be moved in the optical axis direction by which the focused object distance of the variable focal point lens can be changed.

Figure 20:
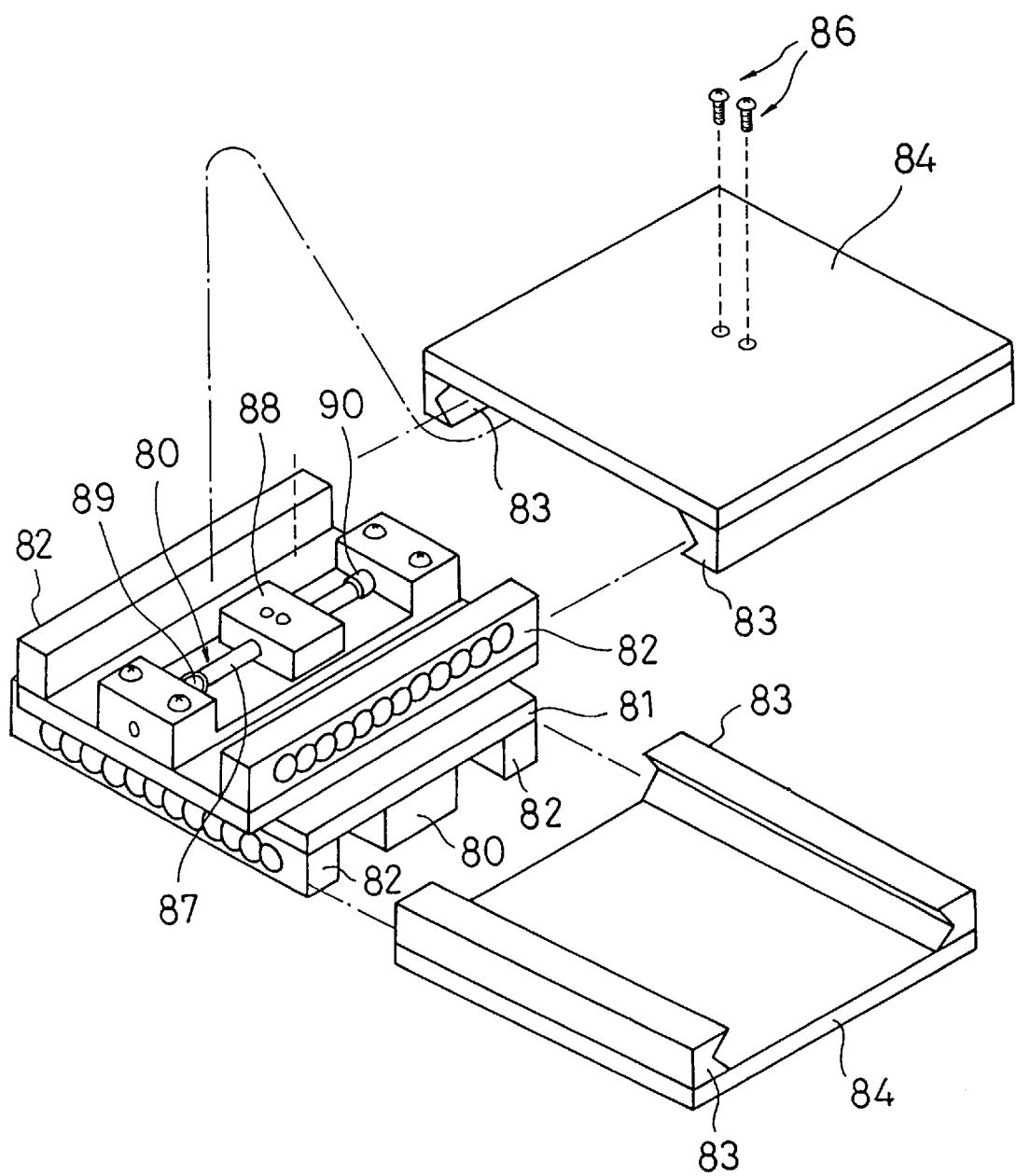
FIG. 20 is a perspective view showing the constitution of an embodiment of an X-Y stage.

FIG. 20 is a partially disassembled perspective view of an eighth embodiment showing the constitution of an X-Y stage. According to the X-Y stage, two X-axis moving stages are prepared, a first one of the X-axis moving stages is turned upside down such that its face is directed upwardly, and a base of a second one of the X-axis moving stages is fixedly arranged on the base by shifting the angle by 90° with respect to the base of the first moving stage. Hereinafter, an explanation will be given of only the first X-axis moving stage.

In FIG. 20, numeral 81 designates a base, numeral 82 designates linear ball bearings installed at side edges of the base 81, numeral 84 designates a table on which an object is mounted and on a lower face of which slide portions 83 engaged with the linear ball bearings 82 are installed. Further, an actuator 80 is fixedly arranged on a central portion of the base 81.

Two rows of linear ball bearings 82, of a publicly-known variety, are arranged parallel to each other and are engaged with two of the side portions 83. Side portions 83 are parallel to the lower side of side edges of table 84 and support the table 84. The table 84 is parallelly movable relative to the base 81. A slider 88 of the actuator 80 is fixed to the central portion of the table 84 by screws 86.

The actuator 80 is provided with the same constitution as that previously explained in reference to FIG. 1, a piezoelectric element 87 in a tubular shape is fixedly held on the table 84, and the slider 88 is frictionally coupled to the piezoelectric element 87. Explaining a relationship thereof in correspondence with the actuator shown in FIG. 1, the piezoelectric element 87 corresponds to the piezoelectric element 14 of the actuator of FIG. 1, the slider 88 corresponds to the slider 15 of the actuator of FIG. 1, outer electrodes 89 and 90 and a common electrode in side of tubular piezoelectric element 87 are members respectively corresponding to the outer electrodes 16 and 17 and the common electrode 18 of the actuator of FIG. 1, and details of the constitution and the function are as has been explained previously.

The operation is also as has been explained previously, when reciprocating oscillation having different speeds is caused by applying drive pulses of a saw tooth wave between the outer electrodes 89 and 90 and the common electrode of the piezoelectric element 87, the slider 88 frictionally coupled to the piezoelectric element 87 is moved by which the table 84 can be moved.

As has been explained, according to the actuator of each aforesaid embodiment, the mechanical strength is high and the transmission efficiency is improved since there is no constituent portion in the electromechanical transducer for fixedly adhering a separate drive shaft member or the like and further, high reliability can be ensured since there is no concern of causing an adheringly coupled portion to peel off or the like and the number of parts is small, an adheringly coupled portion is dispensed with and therefore, an actuator that is easy to assemble can be provided.

Further, a frictional coupling force at a frictionally coupled portion is controlled in synchronism with drive timings, the frictional coupling force is weak for easy sliding at a time point that slip is caused between the drive shaft member and the moving member and accordingly, the drive efficiency can be promoted.

Further, oscillation in a direction orthogonal to the axial direction is not caused since both end portions of the electromechanical transducer are fixedly supported with no free end. Furthermore, a reflected wave produced by reflecting an oscillation wave of the electromechanical transducer at the free end and the generated oscillation wave do not interfere with each other and accordingly, an actuator having better performance than a conventional actuator, such as higher drive efficiency and noiselessness, can be provided.

What is claimed is:

1. An actuator using an electromechanical transducer, said actuator comprising:

an electromechanical transducer where a first electrode portion is formed in a vicinity of a first end portion of the electromechanical transducer and a second electrode portion is formed in a vicinity of a second end portion of the electromechanical transducer;

supporting members to support the first end portion and the second end portion;

a moving member adopted to frictionally engage the electromechanical transducer to move by frictional coupling along the electromechanical transducer; and a controller;

wherein the controller, being electrically coupled to the first electrode portion and the second electrode portion, is adapted to oscillate the electromechanical transducer through an application of a prescribed first signal to one of the first electrode portion and the second electrode portion to effect at least a localized elongation displacement of the electromechanical transducer and to apply a prescribed second signal to a remaining one of the first electrode portion and the second electrode portion of the electromechanical transducer to effect at least a complementary localized contraction displacement of the electromechanical transducer.

2. An actuator using an electromechanical transducer according to claim 1, wherein said electromechanical transducer is tubular and formed in a cylindrical shape, and said first and second electrode portions are constituted respectively by electrode elements provided on an outer side of the electromechanical transducer and an at least one electrode element provided on inner side of the electromechanical transducer.

3. An actuator using an electromechanical transducer according to claim 1:

wherein portions of the electromechanical transducer at the vicinities of the first electrode portion and the second electrode portion are polarized in a same direction.

4. An actuator using an electromechanical transducer according to claim 1:

wherein portions of the electromechanical transducer at the vicinities of the first electrode portion and the second electrode portion are polarized in directions opposite to each other.

5. An actuator using an electromechanical transducer according to claim 1:

wherein said supporting members are adapted to press the electromechanical transducer in an axial direction.

6. An actuator using an electromechanical transducer according to claim 1, wherein a waveform of the first signal and a waveform of the second signal are substantially similar.

7. An actuator using an electromechanical transducer according to claim 1, wherein a waveform of the first signal to drive the moving member in a prescribed direction is different from a waveform of the second signal to drive the moving member in a direction opposite to the prescribed direction.

8. An actuator using an electromechanical transducer according to claim 7, wherein a speed of movement of the moving member, dictated by said waveform of the first signal, in the prescribed direction is greater than a speed of movement of the moving member in the direction opposite to the prescribed direction.

9. An actuator using an electromechanical transducer, said actuator comprising:

an electromechanical transducer in a tubular shape in which a first electrode portion and a second electrode portion, each comprising an electrode element provided on an outer surface of said electromechanical transducer, are respectively formed at vicinities of both end portions of the electromechanical transducer, and an electrode element is formed on an inner surface of the electromechanical transducer;

supporting members to support both end portions of said electromechanical transducer;

a moving member to move along the electromechanical transducer, the moving member being frictionally coupled to the electromechanical transducer; and a drive circuit;

wherein portions of said electromechanical transducer at vicinities of said first electrode portion and said second electrode portion are polarized in a same direction; and wherein said drive circuit is adapted to control movement of said moving member in a predetermined direction by causing reciprocating oscillation of said electromechanical transducer by applying a drive voltage, such drive voltage having a waveform that changes in a positive direction, to said first electrode portion and applying a drive voltage, such drive voltage having a waveform that changes in a negative direction, to said second electrode portion.

10. An actuator using an electromechanical transducer, said actuator comprising:
- an electromechanical transducer in a tubular shape in which a first electrode portion and a second electrode portion, each comprising an electrode element provided on an outer surface of said electromechanical transducer are respectively formed at vicinities of both end portions of said electromechanical transducer, and an electrode element is formed on an inner surface of the electromechanical transducer;
- supporting members to support both end portions of said electromechanical transducer;
- a moving member to move along the electromechanical transducer, the moving member being frictionally coupled to the electromechanical transducer; and
- a drive circuit;
- wherein portions of said electromechanical transducer at vicinities of said first electrode portion and said second electrode portion are polarized in opposite directions to each other;
- wherein said drive circuit is adapted to control movement of said moving member in a predetermined direction by causing reciprocating oscillation of said electromechanical transducer by applying substantially identical predetermined drive voltages to said first electrode portion and said second electrode portion.

11. An actuator using an electromechanical transducer, said actuator comprising:
- an electromechanical transducer in a tubular shape having a first end portion and a second end portion at least one electrode portion comprising an electrode element provided on an outer surface of said electromechanical transducer formed at a vicinity of at least one end portion of said electromechanical transducer, an electrode element is formed on an inner surface of the electromechanical transducer;
- supporting members for supporting said electromechanical transducer;
- a moving member, being formed, at least in part, of a conductive material, said electromechanical transducer and moved by to move along at least a portion of the outer surface of the electromechanical transducer; and
- a drive circuit;
- wherein said drive circuit is adapted (i) to cause a reciprocating oscillation of said electromechanical transducer by applying a drive voltage having a predetermined asymmetrical waveform to said at least one electrode portion and (ii) to apply a drive voltage to said moving member at a predetermined timing in synchronism with said drive voltage having said predetermined asymmetrical waveform to affect a frictional coupling between said moving member and said electromechanical transducer.

12. An actuator using an electromechanical transducer according to claim 11:
- wherein said drive voltage having said asymmetrical waveform comprises a gradual rise portion and a steep fall portion, and said predetermined timing is a timing in synchronism with said steep fall portion of said asymmetrical waveform of said drive voltage.

13. An actuator using an electromechanical transducer according to claim 11:
- wherein electrode portions are provided at both the first end portion and the second end portion of said electromechanical transducer.

14. An actuator using an electromechanical transducer according to claim 13, wherein said drive circuit is adapted to apply a voltage of a first polarity to said electrode portion at said first end portion and to apply a voltage of a second polarity to said electrode portion at said second end portion.

15. An actuator using an electromechanical transducer according to claim 14, wherein said first polarity and said second polarity are opposite.

16. An actuator using an electromechanical transducer according to claim 14, wherein said first polarity is in accord with said second polarity.

17. An actuator using an electromechanical transducer, said actuator comprising:
- an electromechanical transducer in which a first electrode portion is formed at a vicinity of an end portion of said electromechanical transducer;
- at least one supporting member for supporting said electromechanical transducer;
- a moving member to move along the electromechanical transducer, the moving member being frictionally coupled to the electromechanical transducer; and
- a drive circuit;
- wherein said drive circuit is adapted to control a movement of said moving member along said electromechanical transducer by causing a reciprocating oscillation of said electromechanical transducer, said oscillation having a first speed for displacement of said electromechanical transducer in one direction and a different second speed for displacement of said electromechanical transducer in a direction opposite to said one direction by applying a drive voltage to said first electrode, said drive voltage having a predetermined asymmetrical waveform.

18. An actuator using an electromechanical transducer according to claim 17:
- wherein said electromechanical transducer comprises piezoelectric ceramics formed in a cylindrical shape.

19. An actuator using an electromechanical transducer according to claim 17:
- wherein the first electrode portion comprises a pair of electrode elements respectively provided on an inner side and an outer side of said electromechanical transducer.

20. An actuator using an electromechanical transducer according to claim 17:
- wherein said electromechanical transducer comprises laminated piezoelectric ceramics formed in a flat plate shape.

21. The actuator using an electromechanical transducer according to claim 17:
- wherein said drive voltage is in a range where polarization reversal is not caused.

22. An actuator using an electromechanical transducer according to claim 17:
- further comprising a second electrode portion formed at a vicinity of an end of the electromechanical transducer opposite said first electrode portion, and wherein said drive circuit is further adapted to apply a drive voltage to said second electrode portion, and a drive voltage applied to said second electrode portion is opposite of a drive voltage applied to said first electrode portion.

23. An actuator using an electromechanical transducer, said actuator comprising:
- an electromechanical transducer in a tubular shape in which a first electrode portion, which includes a first electrode element provided on an outer surface of said electromechanical transducer and a second electrode element provided on an inner surface of said electromechanical transducer, is formed at a vicinity of an end portion of said electromechanical transducer and a second electrode portion is formed at a vicinity of a central portion of said electromechanical transducer;

supporting members for supporting said electromechanical transducer;

a moving member attached to said electromechanical transducer and moved by frictional coupling; and a drive circuit;

wherein said drive circuit is adapted (i) to cause reciprocating oscillation of said electromechanical transducer by applying a drive voltage, having a predetermined asymmetrical waveform, to said first electrode portion, and (ii) to cause said electromechanical transducer to at least radially contract in the vicinity of said second electrode portion by applying a drive voltage to said second electrode portion at a predetermined timing in synchronism with said drive voltage applied to said first electrode portion.

24. An actuator using an electromechanical transducer according to claim 23:

wherein said drive voltage having the asymmetrical waveform is a drive voltage comprising a gradual rise portion and a steep fall portion, and said predetermined timing is a timing in synchronism with the steep fall portion of said drive voltage having the asymmetrical waveform.

25. An actuator using an electromechanical transducer according to claim 23:

wherein a third electrode portion is provided at an end portion of said electromechanical transducer, said second electrode portion being positioned between said first electrode portion and said third electrode portion.

* * * * *

UNITED STATES PATENT AND TRADEMARK OFFICE
CERTIFICATE OF CORRECTION

PATENT NO. : 6,140,750
DATED : October 31, 2000
INVENTOR(S) : Masayuki Ueyama

It is certified that error appears in the above-identified patent and that said Letters Patent is hereby corrected as shown below:

<u>Column 11,</u>
Line 50 (claim 1, line 10), delete "adopted", and insert -- adapted --.

<u>Column 12,</u>
Line 6 (claim 2, line 8), before "inner", insert -- an --.

<u>Column 13,</u>
Line 31 (claim 11, line 4), after "second end portion", insert -- , --.
Line 32 (claim 11, line 5), delete "an", and insert -- a first --.
Line 35 (claim 11, line 8), delete "an", and insert -- and a second --.
Line 36, (claim 11, line 9), delete "is".
Lines 41-42 (claim 11, line 14-15), delete "said electromechanical transducer and moved by".

Signed and Sealed this

Twenty-third Day of October, 2001

Attest:

NICHOLAS P. GODICI
*Acting Director of the United States Patent and Trademark Office*

*Attesting Officer*